United States Patent
Inamura et al.

(10) Patent No.: US 8,284,575 B2
(45) Date of Patent: Oct. 9, 2012

(54) DRIVE SYSTEM FOR POWER SWITCHING ELEMENTS

(75) Inventors: Hiroshi Inamura, Nagoya (JP); Tsuneo Maebara, Nagoya (JP); Junichi Fukuta, Anjo (JP)

(73) Assignee: Denso Corporation, Kariya (JP)

( * ) Notice: Subject to any disclaimer, the term of this patent is extended or adjusted under 35 U.S.C. 154(b) by 225 days.

(21) Appl. No.: 12/824,654

(22) Filed: Jun. 28, 2010

(65) Prior Publication Data

US 2011/0012542 A1    Jan. 20, 2011

(30) Foreign Application Priority Data

Jul. 20, 2009   (JP) .................................. 2009-169633

(51) Int. Cl.
*H02H 7/122*   (2006.01)

(52) U.S. Cl. ......... 363/55; 363/21.16; 363/23; 318/800; 318/801

(58) Field of Classification Search .................. 318/657, 318/801, 813, 722, 800, 807; 363/5, 21.07, 363/21.15, 21.16, 23, 27, 40, 45, 46, 55, 363/64, 171, 21.01, 21.12, 56.01; 307/112, 307/31; 323/297; 257/130
See application file for complete search history.

(56) References Cited

U.S. PATENT DOCUMENTS

| | | | | |
|---|---|---|---|---|
| 4,236,196 A | * | 11/1980 | Koizumi et al. | ............. 363/21.1 |
| 6,504,267 B1 | * | 1/2003 | Giannopoulos | ................. 307/31 |
| 6,577,511 B2 | * | 6/2003 | Yamaguchi et al. | ....... 363/21.07 |
| 7,251,146 B2 | * | 7/2007 | Aso | ............................. 363/21.04 |
| 7,778,046 B1 | * | 8/2010 | Cuk et al. | ........................ 363/16 |
| 2005/0168087 A1 | * | 8/2005 | Yasumura | ..................... 310/120 |
| 2008/0061746 A1 | | 3/2008 | Kobayashi et al. | |
| 2009/0279337 A1 | | 11/2009 | Hamatani | |

FOREIGN PATENT DOCUMENTS

| | | |
|---|---|---|
| JP | B2-3052792 | 6/2000 |
| JP | A-2002-198792 | 7/2002 |
| JP | A-2004-096318 | 3/2004 |
| JP | A-2005-020919 | 1/2005 |
| JP | A-2006-180606 | 7/2006 |
| JP | A-2006-280100 | 10/2006 |
| JP | A-2007-274876 | 10/2007 |
| JP | A-2008-017682 | 1/2008 |
| JP | A-2009-055654 | 3/2009 |

OTHER PUBLICATIONS

Japanese Office Action issued in Japanese Application No. 2009-169633 dated May 10, 2011 (with translation).

* cited by examiner

*Primary Examiner* — Antony M Paul
(74) *Attorney, Agent, or Firm* — Oliff & Berridge, PLC

(57) ABSTRACT

A drive system has a low voltage system, a high voltage system, and a transformer. The high voltage system has drive units which correspond to power switching elements. A capacitance in the high voltage system serves as a flouting power source which supplies electric power to each of the drive units. An output voltage of a secondary side coil of the transformer is supplied to the capacitance. A comparator compares the output voltage at the secondary side coil of the transformer with a threshold value. A switching speed change part changes the switching speed of each of the power switching element based on the comparison result of the comparator.

9 Claims, 6 Drawing Sheets

TEMPERATURE

SWITCHING ELEMENT 30

OUTPUT VOLTAGE

SWITCHING TEMPERATURE

→ TIME

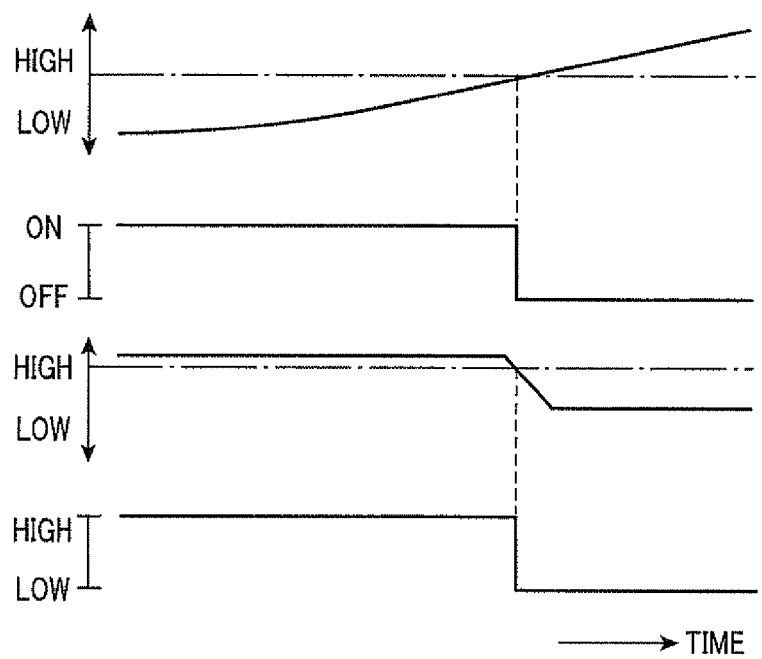
FIG.6A INPUT VOLTAGE OF INVERTER
FIG.6B SWITCHING ELEMENT 30
FIG.6C OUTPUT VOLTAGE
FIG.6D SWITCHING SPEED
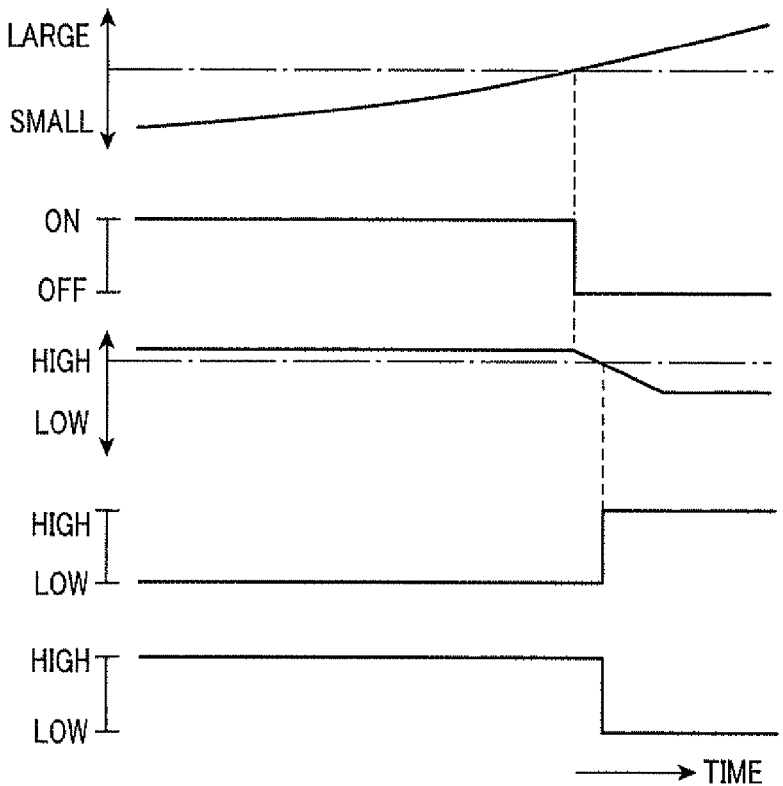
FIG.7A AMPLITUDE OF PHASE CURRENT
FIG.7B SWITCHING ELEMENT 30
FIG.7C OUTPUT VOLTAGE
FIG.7D SWITCHING SPEED(ON)
FIG.7E SWITCHING SPEED(OFF)

DRIVE SYSTEM FOR POWER SWITCHING ELEMENTS

CROSS-REFERENCE TO RELATED APPLICATION

This application is related to and claims priority from Japanese Patent Application No. 2009-169633 filed on Jul. 20, 2009, the contents of which are hereby incorporated by reference.

BACKGROUND OF THE INVENTION

1. Field of the Invention

The present invention relates to a drive system for changing the switching speed of power switching elements.

2. Description of the Related Art

There is a conventional technique to change the switching speed of the power switching elements which form an inverter electrically connected to an on-vehicle device such as a motor generator mounted to a vehicle. For example, Japanese patent publication No. 3052792 discloses such a conventional technique to change the switching speed of a switching element in an inverter based on an input voltage supplied to the inverter. Decreasing the switching speed of the switching element suppresses generation of surge noise, but increases electric power loss generated on changing the switching speed of the switching element. That is, in order to maintain the reliability in operation of the switching element, it is necessary to prevent the switching element from receiving an excess voltage of not less than a withstand voltage of the switching element. Therefore it is necessary to increase the switching speed, as high as possible, within a range where surge noise does not exceed its upper limit value in order to suppress the electric power loss generated when the switching speed is switched. Because of the upper limit value of such surge noise depends on an input voltage supplied to the inverter, it is possible to increase the switching speed as high as possible by optionally changing the switching speed according to the magnitude of the input voltage supplied to the inverter while preventing the input voltage supplied to the switching element from increasing too excessively.

The above inverter forms a high voltage system which is electrically insulated from a low voltage system in a drive system for changing the switching speed of the switching element, where the high voltage system and the low voltage system are mounted to a vehicle. In general, the low voltage system in the drive system manages various types of information such as an input voltage supplied to the inverter. Accordingly, it is necessary for the low voltage system to generate and supply the input voltage information and an instruction signal to change the switching speed of the switching element to the high voltage system. In order for the low voltage system to transfer such information and instruction signal to the high voltage system, the conventional derive system requires an additional insulation means such as a photocoupler.

In not only the above conventional technique, but also other systems capable of changing the switching speed of each of power switching elements, it is necessary to add an additional insulation means in order to transfer the operation signal (which serves as the instruction signal) to instruct the power switching element to change its switching speed from the low voltage system to the high voltage system.

SUMMARY OF THE INVENTION

It is an object of the present invention to provide a drive system for changing the switching speed of each of power switching elements. The drive system according to the present invention is capable of correctly transferring an instruction signal to instruct the switching speed of each of the power switching elements to be changed without incorporating any additional insulation means.

To achieve the above purposes, the present invention provides a drive system that changes a switching speed of each of power switching elements. The drive system has an operation means, a voltage control means, a drive means, and a change means. The operation means controls the operation of a transformer which is composed of primary side coils and secondary side coils so that the operation means controls turning-on and off of the primary side coils of the transformer in order to change an output voltage of each of the secondary side coils. The voltage control means controls the output voltage of each of the secondary side coils of the transformer to a predetermined voltage. The drive means supplies the output voltage of the voltage control means to a corresponding power switching element in order to drive the power switching elements. The change means changes the switching speed of each of the power switching element based on the output voltage of each of the secondary side coils of the transformer.

The drive system according to the present invention uses the output voltage of the secondary side coil of the transformer in order to generate the operation signal to instruct the switching speed of the power switching element to be changed. The drive system can transfer the operation signal from the primary side to the secondary side of the transformer in order to change the switching speed of the power switching element without adding any additional insulation means.

In the drive system as another aspect of the present invention, the operation means controls the turning-on and off of the electric power supply of each of the primary side coils of the transformer based on a temperature of each of the power switching elements in order to change the output voltage of each of the secondary side coils of the transformer.

In general, a withstand voltage of the power switching element is changed according to the change of a temperature thereof. That is, the more the temperature of the power switching element is decreased, the more the withstand voltage of the power switching element decreases. From considering this viewpoint, the drive system according to the present invention changes the switching speed of the power switching element based on the temperature of the power switching element. This control makes it possible to largely suppress the electric power loss caused when the switching speed of the power switching element is changed while avoiding applying an excess voltage of not less than the withstand voltage to the power switching element.

In the drive system as another aspect of the present invention, the power switching elements form an inverter which is electrically connected to an electric rotary machine. The operation means controls the turning-on and off operation of the electric power supply of each of the primary side coils of the transformer based on input voltage information of the inverter in order to change the output voltage of each of the secondary side coils of the transformer.

The voltage which is supplied to the power switching element depends on the input voltage of the inverter. From considering this viewpoint, the drive system according to the present invention changes the switching speed of the power switching element based on the magnitude of the input voltage of the inverter. This control makes it possible to largely suppress the electric power loss caused when the switching speed of the power switching element is changed while avoiding applying an excess voltage of not less than the withstand voltage to the power switching element.

In the drive system as another aspect of the present invention, the operation means controls the turning-on and off of the electric power supply of each of the primary side coils of the transformer based on information of a current flowing in the power switching elements in order to change the output voltage of each of the secondary side coils of the transformer.

In general, the magnitude of surge noise which is received by the power switching element depends on the current which flows in the power switching element. From considering this viewpoint, the drive system according to the present invention changes the switching speed of the power switching element based on the information of the current which flows in the power switching element. This control makes it possible to largely suppress the electric power loss caused when the switching speed of the power switching element is changed while avoiding applying an excess voltage of not less than the withstand voltage to the power switching element.

In the drive system as another aspect of the present invention, the operation means changes in steps the output voltage of each of the secondary side coils of the transformer. The change means changes in steps the switching speed of each of the power switching elements based on the changes in steps of the output voltage of the secondary side coils of the transformer.

In the drive system as another aspect of the present invention, the operation means changes in analogue form the output voltage of each of the secondary side coils of the transformer. The change means changes in analogue form the switching speed of each of the power switching elements based on the change in analogue form of the output voltage of the secondary side coils of the transformer.

Accordingly, the above control makes it possible to largely suppress the electric power loss caused when the switching speed of the power switching element is changed while avoiding applying an excess voltage of not less than the withstand voltage to the power switching element.

In the drive system as another aspect of the present invention, the voltage control means decreases the output voltage of each of the secondary side coils of the transformer. The operation means decreases the output voltage of each of the secondary side coils of the transformer when the temperature of the power switching elements becomes higher than a predetermined temperature.

In the above drive system according to the present invention, because the voltage control means decreases the output voltage of the transformer, there is a possibility of relatively increasing electric power loss when the transformer converts the voltage which allows the output voltage to increase. On the other hand, there is a relationship between the temperature and the switching speed of the power switching element. In general, the more the temperature of the power switching element is high, the more the temperature of the drive unit becomes higher than a predetermined temperature. From considering this viewpoint, the drive system according to the present invention, the temperature rise of the drive unit is suppressed as low as possible by decreasing the output voltage of the transformer when the temperature of the power switching element becomes higher than a predetermined temperature.

In the drive system as another aspect of the present invention, the change means changes at least one of: (a-1) a resistance value of an electric path between the voltage control means and an conductive control terminal of each of the power switching elements; (a-2) a capacitance of the electric path between the voltage control means and the conductive control terminal of each of the power switching elements; and (a-3) the output voltage of the voltage control means.

In the drive system as another aspect of the present invention, the transformer forms a flyback type converter.

By the way, the drive system according to the present invention controls the switching speed of each of a plurality of the power switching elements. In the drive system, the transformer is composed of a plurality of the primary side coils and a plurality of the secondary side coils. In this circuit configuration of the drive system, each of the secondary side coils is equipped with a choke coil in order to smooth the current flowing in the secondary side coil of the transformer when the transformer is the forward type converter.

On the other hand, when the transformer is the flyback type converter, it is possible to smooth the current flowing in the secondary side coil by using the primary side coil. This makes it possible to decrease the total number of the components which form the drive system.

BRIEF DESCRIPTION OF THE DRAWINGS

A preferred, non-limiting embodiment of the present invention will be described by way of example with reference to the accompanying drawings, in which:

FIG. 6A is a timing chart showing the transition of the input voltage to the inverter IV according to a fourth embodiment of the present invention;

FIG. 6B is a timing chart showing the transition of the voltage potential of the switching element 30;

FIG. 6C is a timing chart showing the transition of the output voltage of the transformer in the drive system;

FIG. 6D is a timing chart showing the transition of the power switching speed of the power switching element Sw;

FIG. 7A is a timing chart showing the transition of an amplitude of the phase current flowing in the power switching element Sw;

FIG. 7B is a timing chart showing the transition of the voltage potential of the switching element 30;

FIG. 7C is a timing chart showing the transition of the output voltage of the transformer in the drive system;

FIG. 7D is a timing chart showing the switching speed of the power switching element Sw when turned on;

FIG. 7E is a timing chart showing the switching speed of the power switching element Sw when turned off;

DETAILED DESCRIPTION OF THE PREFERRED EMBODIMENTS

Figure 1:
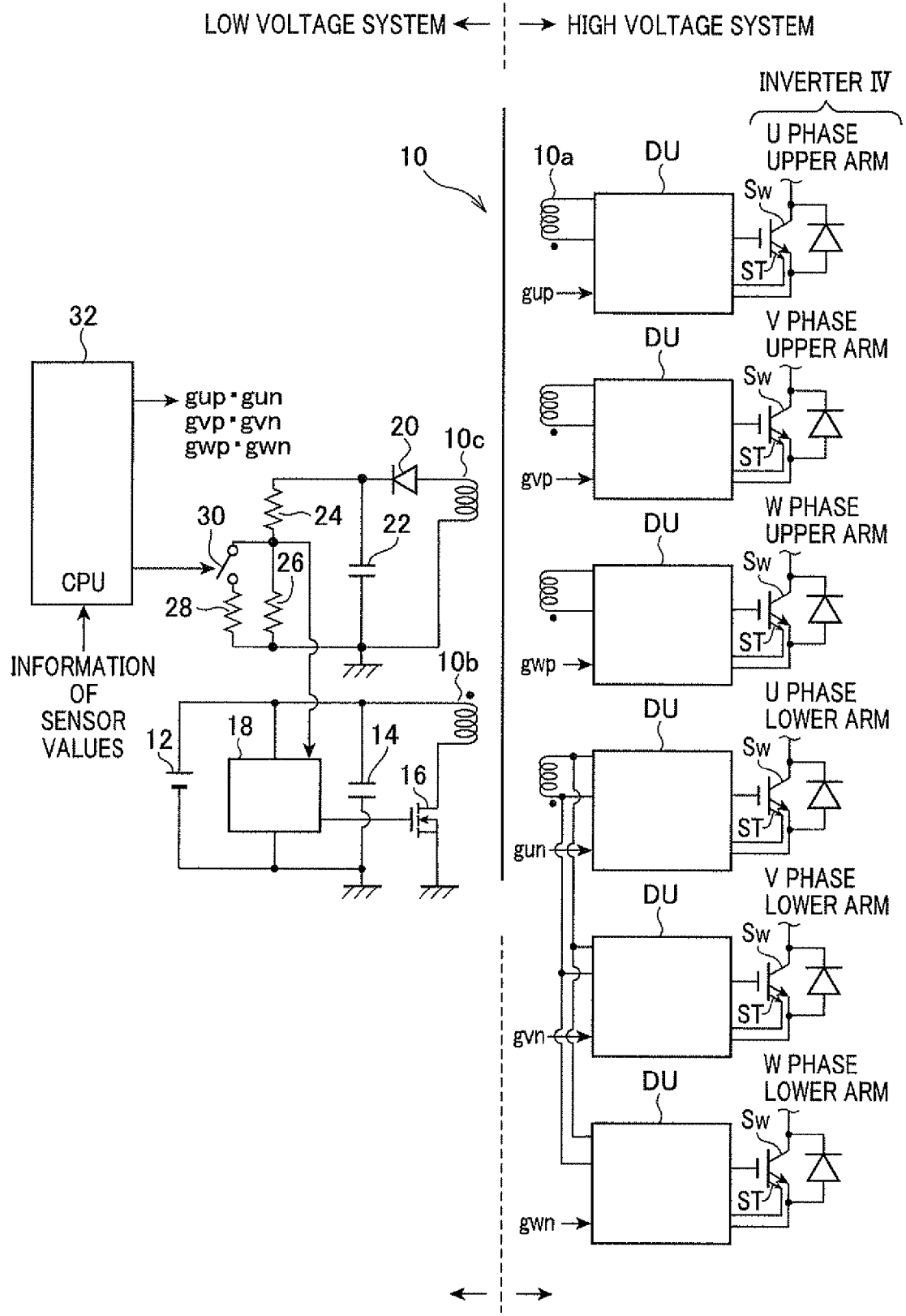
FIG. 1 is a view showing a schematic configuration of a drive system having a plurality of drive units DU according to a first embodiment of the present invention.

Hereinafter, various embodiments of the present invention will be described with reference to the accompanying drawings. In the following description of the various embodiments, like reference characters or numerals designate like or equivalent component parts throughout the several diagrams.

First Embodiment

A description will be given of a drive system for changing the switching speed of power switching elements with reference to FIG. 1, FIG. 2, and FIG. 3A to FIG. 3D. For example, the drive system according to the first embodiment is mounted to various types of vehicles such as a hybrid vehicle, with reference to drawings.

A hybrid vehicle is a vehicle that uses two or more distinct power sources to move the vehicle, for example, hybrid electric vehicles (HEVs) which combine an internal combustion engine and one or more electric rotary machines such as a motor generator and an electric motor. FIG. 1 is a view showing a schematic configuration of the drive system having a plurality of the drive units DU according to the first embodiment.

As shown in FIG. 1, the drive system is comprised of a transformer 10, a low voltage system, and a high voltage system. The transformer 10 serves as an insulation means with which the low voltage system and the high voltage system are insulated from each other. The low voltage system uses a reference voltage which is equal to a voltage potential of the hybrid vehicle body. Accordingly, the low voltage system in the drive system of the hybrid vehicle is equipped with electric devices which operate by a predetermined low voltage (for example, within a range of several volts to several tenth volts). On the other hand, the high voltage system in the drive system in the hybrid vehicle is equipped with a motor generator as a main device which operates with a predetermined high voltage (for example, within a range of hundred volts to thousand and several hundredth volts).

As shown in FIG. 1, the drive system has a plurality of drive units DU. The drive units DU drive the corresponding power switching elements Sw which form an inverter IV. The inverter IV is electrically connected to the motor generator. Each of the drive units DU drives the corresponding power switching element Sw. The drive unit DU operates when receiving electric power supplied from the low voltage system through the transformer 10.

The drive unit DU changes the voltage of the conductive control terminal (that is, the gate terminal) of the power switching unit Sw in order to turn on or off the corresponding power switching unit Sw, where the voltage (emitter voltage) of the output terminal of the power switching element Sw is a reference voltage. In the first embodiment, an insulated gate bipolar transistor (IGBT) with a sense terminal ST is used as the power switching element Sw, where the sense terminal ST of the IGBT outputs a weak current which is correlated with the collector current flowing in the IGBT.

A battery 12 and a capacitance 14 are connected in parallel to a primary side coil 10b of the transformer 10. The capacitance 14 serves as the charging means to accumulate electric energy of the battery 12, and also serves as the power supply source to supply the electric energy to the primary side coil 10b of the transformer 10.

A switching element 16 opens and closes a loop circuit which is composed of the primary side coil 10b and the capacitance 14.

A voltage control part 18 generates a control signal regarding a ratio (or a time ratio) of a turning-on period of the switching element 16 to a period of the turning-on and off period of the switching element 16, and transfers the control signal indicating the time ratio to the switching element 16 in order to control the output voltage of the transformer 10. In more detail, the voltage control part 18 performs feedback control of the output voltage of the transformer 10.

The detection means to detect the output voltage of the transformer 10 has the following circuit structure.

As shown in FIG. 1, a capacitance 22 is electrically connected in parallel to another primary side coil 10c of the transformer 10 through a diode 20. A resistance 24 and a resistance 26 which are electrically connected in series together are electrically connected to capacitance 22. The voltage between the both terminals of the primary side coil 10c (or the voltage between the both terminals of the capacitance 22) is divided by the resistance 24 and the resistance 26. The voltage at the connection node between the resistance 24 and the resistance 26 becomes a detection value of the output voltage of the transformer 10. That is, as shown in FIG. 1, the voltage of the primary side coil 10c and the voltage of the secondary coil 10a of the transformer 10 have a constant relationship based on a turn ratio of the primary side coil 10c and the secondary side coil 10a. It is therefore possible to indirectly detect the voltage between the both terminals of the secondary side coil 10a by directly detecting the voltage between the both terminals of the primary side coil 10c.

A central processing unit (CPU) 32 receives output signals (regarding sensor values) transferred from various types of sensors, and generates operation signals to control the operation of the power switching element Sw based on the received output signals (sensor values) transferred from the sensors.

In the drive system according to the first embodiment, the CPU 32 generates the operation signals gup, gyp, and gwp to control a U phase upper arm, a V phase upper arm, and a W phase upper arm, and also generated the operation signals gun, gvn, and gwn to control a U phase lower arm, a V phase lower arm, and a W phase lower arm. These operation signals are transferred to the drive units DU in order to control the operation of these arms through an insulation means such as a photocoupler (omitted from the drawings).

Figure 2:
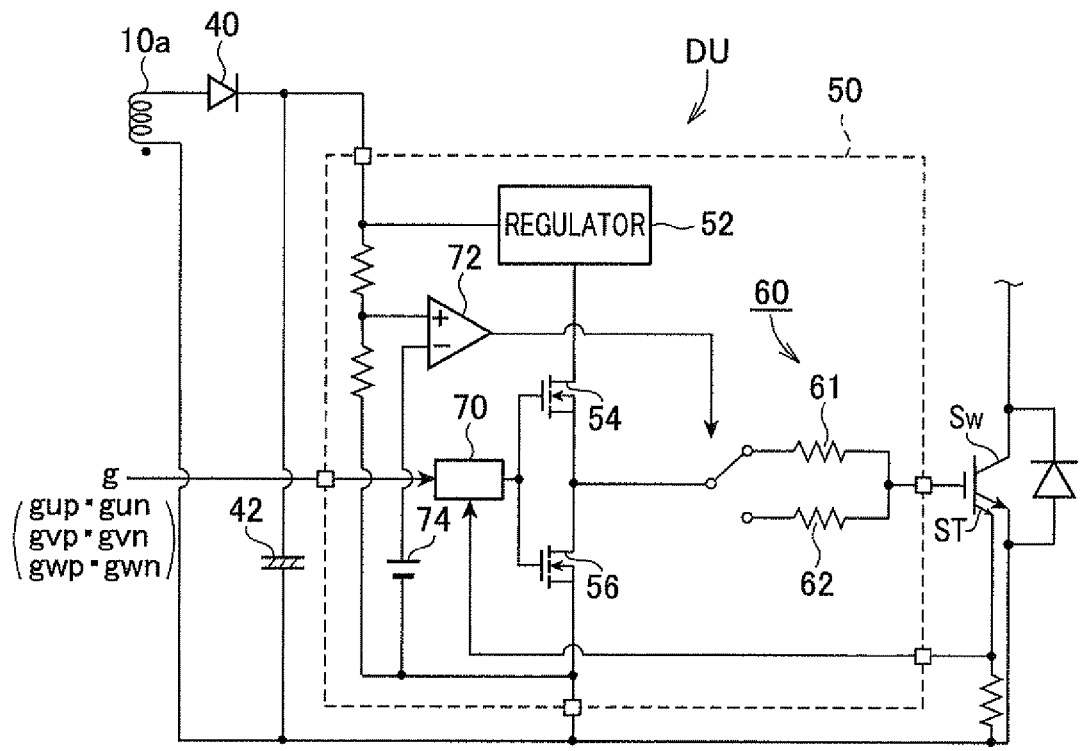
FIG. 2 is a view showing a circuit configuration of each of the drive units DU in the drive system shown in FIG. 1.

FIG. 2 is a view showing a circuit configuration of each of the drive units DU in the drive system shown in FIG. 1. As shown in FIG. 2, the secondary side coil 10a is electrically connected to a diode 40. The transformer 10 serves as a flyback converter by using this diode 40. That is, the diode 40 prevents the current from flowing in the secondary side coil 10a while the switching element 16 is turned on, and allows the current in the secondary side coil 10a to flow when the switching element 16 is turned off. A pair of the terminals of the secondary side coil 10a is electrically connected to the capacitance 42 through the diode 40. The capacitance 42 serves as the power source (or floating power source) of the drive unit DU.

As shown in FIG. 2, each of the drive units DU is equipped with a drive IC 50. The drive IC 50 has a regulator 52 which adjusts the output voltage of the secondary side coil 10a to a constant voltage. The regulator 52 is a voltage output means capable of adjusting the voltage which is supplied to the gate terminal of the power switching element Sw with high accuracy. That is, as shown in FIG. 1, the secondary side coil 10a of the transformer 10 is placed at each of the U phase upper arm, the V phase upper arm, and the W phase upper arm, the U phase lower arm, the V phase lower arm, and the W phase lower arm, respectively.

The output voltage of each of the secondary side coil 10a of the transformer 10 is fluctuated based on a different parasitic capacitance generated between the emitter and gate of the power switching element Sw in each of the power source elements Sw. In other words, each of the power switching elements Sw has a different parasitic capacitance generated between the emitter and gate thereof.

The drive unit DU without the regulator 52 decreases the accuracy to control the gate voltage of the power switching element Sw. The regulator 52 decreases the voltage of the secondary side coil 10a of the transformer 10.

The output terminal of the regulator 52 is electrically connected to the gate of the power switching element Sw through a charge switching element 54 and a switching speed change part 60.

The gate is electrically connected to the emitter of the power switching element Sw through the switching speed change part 60 and the discharge switching element 56.

A drive part 70 in the drive unit DU receives the operation signal "g" transferred from the low voltage system in the drive system, previously described, and instructs the charge switching element 54 and the discharge switching element 56 to be turned on or off in order to turn on or off the power switching element Sw. That is, when the charge switching element 54 is turned on and the discharge switching element 56 is turned off, the voltage output from the regulator 52 is supplied to the gate of the power switching element Sw. This turns on the power switching element Sw.

On the other hand, when the charge switching element 54 is turned off and the discharge switching element 56 is turned on, the capacity of the power switching element Sw is discharged through the gate thereof in order to turn off the power switching element Sw.

The drive part 70 receives the detection value indicating the magnitude of the current which flows in the power switching element Sw based on the output current through the sense terminal ST of the power switching element Sw. The drive part 70 forcedly turns off the power switching element Sw regardless of the presence of receiving the operation signal "g" when the current flowing in the power switching element Sw excesses a predetermined value.

<Switching Speed Change Operation>

A description will now be given of the switching process to change the switching speed of the power switching element Sw by the control unit DU according to the first embodiment of the present invention.

In the drive system according to the first embodiment, the switching speed of the power switching element Sw is changed based on the output voltage of the secondary side coil 10a in the transformer 10. In order to achieve this, each of the drive units DU is capable of changing the output voltage of the transformer 10.

That is, as shown in FIG. 1, the resistance 26 is electrically connected in parallel to the switching element 30 and the resistance 28. When the switching element 30 is turned off, the voltage of the primary side coil 10c of the transformer 10 is divided by the resistance 24 and the resistance 26.

On the other hand, when the switching element 30 is turned on, the voltage of the primary side coil 10c of the transformer 10 is divided by the resistance 26 and the resistance 28. Accordingly, the divided voltage becomes low when compared with that when the switching element 30 is turned on.

The voltage detected by the voltage control part 18 becomes low when the switching element 30 is turned on. The voltage control part 18 controls that the output voltage of the transformer 10 becomes high when the switching element 30 is turned on. As described above, the turned on and off of the switching element 30 is equivalent to the operation of the voltage control part 18 to change the output voltage of the transformer 10.

On the other hand, as shown in FIG. 2, the drive IC 50 has a comparator 72 which serves as a detection means to detect whether or not the output voltage of the secondary side coil 10a of the transformer 10 is a threshold voltage.

The output voltage of the primary side coil 10b of the transformer 10 is supplied to one input terminal (non-inverted input terminal) of the comparator 72, and the reference voltage of the reference power source 74 is supplied to the other terminal (inverted input terminal) of the comparator 72.

Because the reference power source 74 generates the reference voltage by dropping the voltage of the primary side coil 10b of the transformer 10, the divided voltage obtained by dividing the output voltage of the secondary side coil 10a is supplied to the one input terminal (non-inverted input terminal) of the comparator 72.

The control signal indicating the comparison result between the output voltage of the secondary side coil 10a of the transformer 10 and the threshold voltage is supplied to the switching speed change part 60. When receiving the control signal indicating the comparison result, the switching speed change part 60 switches the switching speed based on the received control signal. In more detail, the switching speed change part 60 has a pair of the resistances 61 and 62 having a different resistance value. The switching speed change part 60 selects one of the resistances 61 and 62 based on the control signal supplied from the comparator 72. The selected resistance is used as the gate resistance of the power switching element Sw in the electric line through which electric capacity is charged to or discharged from the gate of the power switching element Sw. In more detail, when the resistance having a large resistance value is used in the resistances 61 and 62, the change speed of the voltage at the gate of the power switch element Sw is thereby decreased.

On the other hand, when the resistance having a smaller resistance value is used in the resistances 61 and 62, the change speed of the voltage at the gate of the power switch element Sw is thereby increased. This changes the switching speed of the power switching element Sw.

The switching speed of the power switching element Sw is changed based on a temperature of the power switching element Sw in considering from that the more the temperature of the power switching element Sw decreases, the more the withstand voltage of the power switching element Sw decreases.

That is, when the temperature of the power switching element Sw is low, the voltage supplied to the gate of the switching speed change part 60 is decreased in order to decrease the switching speed of the power switching element Sw. This control suppresses the generation of surge noise in the power switching element Sw. It is possible to detect the temperature of the power switching element Sw based on a detection value of a temperature detection means such as a temperature sensitive diode or a means to detect the temperature of cooling water which is used to cool the power switching element Sw.

Figure 3A:
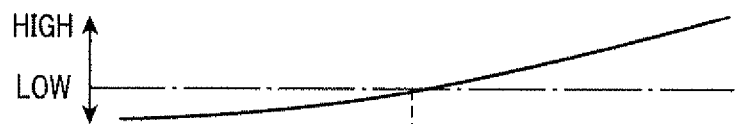
FIG. 3A is a timing chart showing the transition of the switching speed of the power switching element Sw based on a temperature change.
Figure 3B:
FIG. 3B is a timing chart showing the transition of the voltage potential of the switching element 30.
Figure 3C:
FIG. 3C is a timing chart showing the transition of the output voltage of the transformer in the drive system shown in FIG. 1.
Figure 3D:
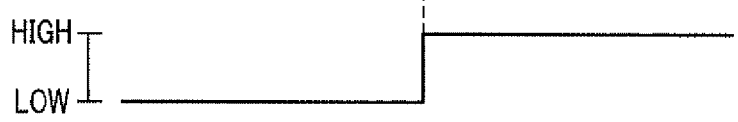
FIG. 3D is a timing chart showing the transition of the power switching speed of the power switching element Sw.

FIG. 3A is a timing chart showing the transition to change the switching speed of the power switching element Sw based on a temperature change. FIG. 3B is a timing chart showing the transition to change a voltage potential of the power switching element Sw. FIG. 3C is a timing chart showing the transition to change the output voltage of the transformer 10 in the drive system. FIG. 3D is a timing chart showing the transition to change the switching speed of the power switching element Sw.

As shown in FIG. 3A to FIG. 3D, when the temperature of the power switching element Sw is not less than a threshold value designated by the long and dash line shown in FIG. 3A, the switching element 30 is turned off (see FIG. 3B). This control decreases the output voltage of the transformer 10, the switching speed of the power switching element Sw is increased when the output voltage of the transformer 10 becomes not more than the threshold value designated by the long and dash line shown in FIG. 3C.

The drive system equipped with the low voltage system and the high voltage system having a plurality of the drive units DU according to the first embodiment has the following effects (1) to (6).

(1) The switching speed of the power switching element Sw is changed according to the magnitude of the output voltage of the transformer 10. This transmits the control signal to change the switching speed of the power switching element Sw from the primary side coil to the secondary side coil of the transformer 10 without adding any additional insulation means.

(2) The time ratio of the turned-on period of the switching element 16 to the period of the turned-on and off period of the switching element 16 is changed based on the information indicating the temperature of the power switching element Sw. This can control the generation of the electric power loss as low as possible caused when the switching speed of the power switching element Sw is changed while avoiding supplying an excess voltage of more than the withstand voltage to the power switching element Sw.

(3) The switching speed of the power switching element Sw is set to two values by changing the output voltage of the transformer 10 in two voltage stages. This can realize the power switching element Sw capable of changing the switching speed of the power switching element Sw with a simple configuration.

(4) The regulator 52 is placed, which controls the output voltage of the transformer 10 to a regulated voltage. This can control the voltage which is supplied to the power switching element Sw with high accuracy.

The drive system according to the first embodiment detects the current flowing in the power switching element Sw based on the output current of the sense terminal ST of the power switching element Sw. The detection result of this current flowing in the power switching element Sw depends on the voltage which is supplied to the gate of the power switching element Sw. Accordingly, the detection accuracy to detect the current depends on the control accuracy to adjust the voltage to be supplied to the gate of the power switching element Sw. Because the regulator 52 in the drive unit DU in the drive system according to the first embodiment adjusts the voltage to be supplied to the gate of the power switching element Sw, it is possible to maintain the detection accuracy to detect the current with high accuracy.

(5) The drive unit DU in the drive system according to the first embodiment uses the regulator capable of decreasing the output voltage (of the secondary coil) of the transformer 10. When the temperature of the power switching element Sw is high, the regulator 52 in the drive unit DU decreases the output voltage of the transformer 10. This makes it possible to relax the condition to easily increase the temperature of the drive unit DU. That is, when the regulator 53 has the function to decrease the output voltage of the transformer 10, the more the output voltage of the transformer 10 increases, the more the thermal energy of the regulator 52 increases.

On the other hand, when the temperature of the power switching element Sw is high, the more the temperature of the drive unit DU easily increases because of supplying the thermal energy of the power switching element Sw to the drive unit DU. Accordingly, when the power switching element Sw has a high temperature, it is preferable to decrease the thermal energy of the regulator 52, and decreases the thermal energy of the drive unit DU (drive IC 50).

(6) In the drive system according to the first embodiment, the transformer 10 forms a flyback type converter. This can form the means to smooth the current flowing in the secondary side coil 10a of the transformer 10 by using the primary side coil 10b of the transformer 10. It is thereby possible to decrease the number of circuit components to form the drive unit DU according to the first embodiment.

Second Embodiment

A description will be given of the drive system for power switching elements according to the second embodiment of the present invention with reference to FIG. 4.

Figure 4:
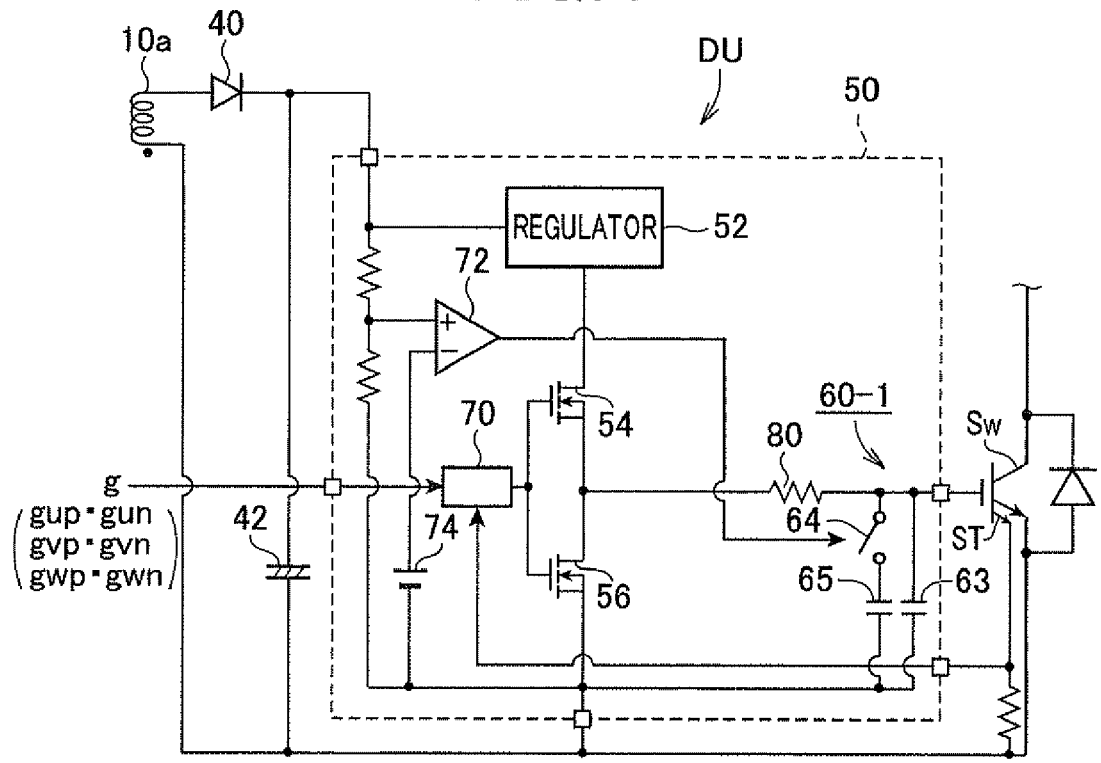
FIG. 4 is a view showing a circuit configuration of the drive unit DU used in the drive system according to a second embodiment of the present invention.

FIG. 4 is a view showing a circuit configuration of the drive unit DU in the drive system according to the second embodiment of the present invention. In the drive unit DU shown in FIG. 4, the same components in the drive unit DU of the first embodiment shown in FIG. 1 and FIG. 2 will be referred with the same reference numbers.

In the drive unit DU shown in FIG. 4, a switching speed change part 60-1 to change the switching speed of the power switching element Sw is composed of a gate capacitance change means.

As shown in FIG. 4, the gate capacitance change means (which serves as the switching speed change part 60-1) is composed of a capacitance 63, a switching element 64, and a capacitance 65. The capacitance 63 is connected in parallel to the switching element 64 and a capacitance 65. The switching element 64 and the capacitance 65 are connected in series. The magnitude of the capacitance between the gate and emitter of the power switching element Sw becomes large when the switching element 64 is turned on, rather than that when the switching element 64 is turned off. It is therefore possible to drop the change speed of the gate voltage of the power switching element Sw.

The gate terminal of the power switching element Sw is electrically connected through a gate resistance 80 to the connection node between the charge switching element 54 and the discharge switching element 56.

It is possible for the driver unit DU in the drive system according to the second embodiment shown in FIG. 4 to have the same effects of the drive unit DU in the drive system according to the first embodiment shown in FIG. 2.

Third Embodiment

A description will be given of the drive unit DU for power switching elements in the drive system according to the third embodiment with reference to FIG. 5.

In the drive unit DU in the drive system according to the third embodiment, the switching means to change the switching speed of the power switching element Sw is composed of a gate voltage change means.

Figure 5:
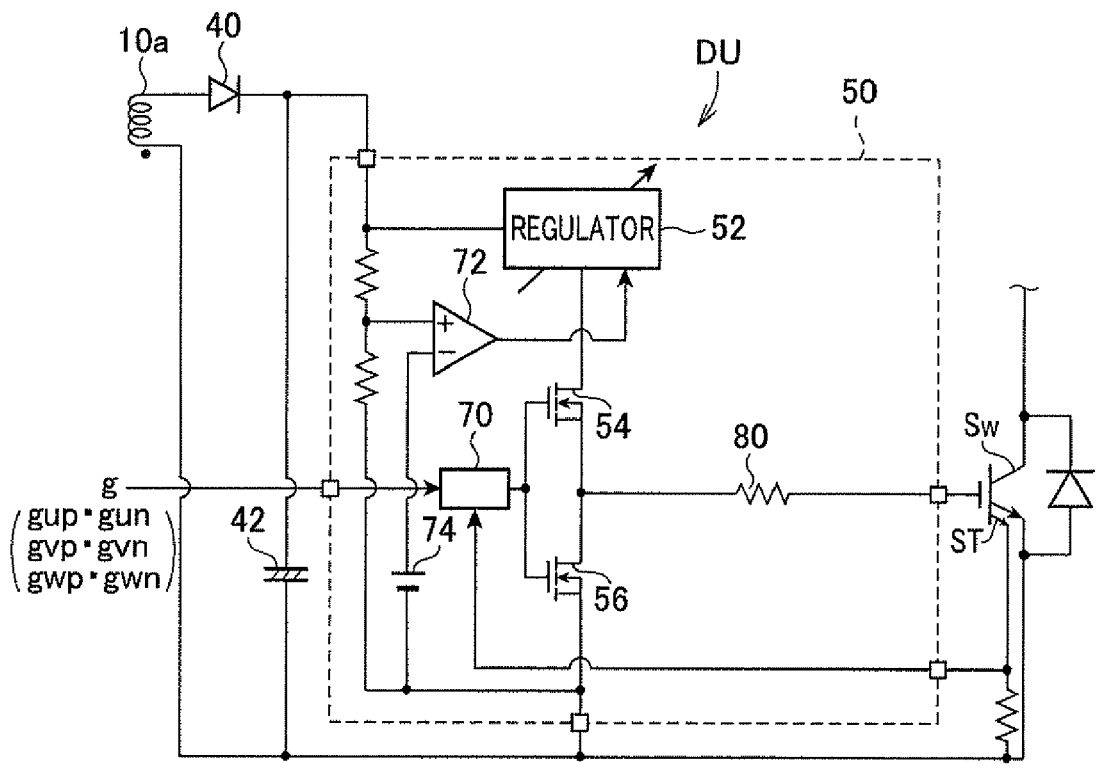
FIG. 5 is a view showing a circuit configuration of the drive unit DU used in the drive system according to a third embodiment of the present invention.

FIG. 5 is a view showing a circuit configuration of the drive unit DU in the drive system according to the third embodiment. In the drive unit DU shown in FIG. 5, the same components in the drive unit DU shown in FIG. 2 will be referred with the same reference numbers.

As shown in FIG. 5, the gate voltage change means is composed of a regulator 52a which is capable of changing the output voltage of the transformer 10. The regulator 52a changes the output voltage of the transformer 10 based on a difference between the output voltage of the transformer 10 and a threshold voltage value. Because the charging speed to charge the gate of the power switching element Sw is changed when the output voltage of the transformer 10 is changed, it is possible to switch the power switching element Sw from the turned-off state to the turned-on state.

It is possible for the driver unit DU in the drive system according to the third embodiment shown in FIG. 5 to have the same effects of the drive unit DU in the drive system according to the first embodiment shown in FIG. 2.

Fourth Embodiment

A description will be given of the drive unit DU for power switching elements in the drive system according to the fourth embodiment with reference to FIG. 6A, FIG. 6B, FIG. 6C, and FIG. 6D.

In the drive unit DU of the drive system according to the fourth embodiment, the switching means changes the switching speed of the power switching element Sw based on the input voltage of the inverter IV.

FIG. 6A to FIG. 6D show the switching process to change the switching speed of the power switching element Sw. In particular, FIG. 6A is a timing chart showing the transition of the input voltage to the inverter IV in the drive system according to the fourth embodiment. FIG. 6B is a timing chart showing the transition of the voltage potential of the switching element 30. FIG. 5C is a timing chart showing the transition of the output voltage of the transformer in the drive system. FIG. 6D is a timing chart showing the transition of the power switching speed of the power switching element Sw.

FIG. 6B to FIG. 6D correspond in timing chart to FIG. 3B to FIG. 3D, respectively. As shown in FIG. 6A to FIG. 6D, when the input voltage of the inverter IV exceeds the predetermined voltage designated by the long and dash line shown in FIG. 6A, the switching element 30 is turned off. This drops the output voltage of the transformer 10. When the output voltage of the transformer 10 is not more than the threshold value designated by the long and dash line shown in FIG. 6C, the switching speed of the power switching element Sw is switched from a high switching speed to a low switching speed. Because this switching control can decrease a surge voltage caused by changing the switching speed of the power switching element Sw, it is possible to suppress the input voltage of the power switching element Sw which is the sum of the input voltage of the inverter IV and the surge voltage.

The drive system according to the fourth embodiment of the present invention further has the following effect (7) in addition to the effects (1) to (6).

(7) In the drive system according to the fourth embodiment, the switching element 30 is controlled in operation based on the input voltage of the inverter IV in order to change the switching speed of the power switching element Sw. This makes it possible to largely decrease electric energy loss caused when the switching speed of the power switching element Sw is changed while avoiding applying any excess voltage of not less than the withstand voltage to the power switching element Sw.

Fifth Embodiment

A description will be given of the drive system for power switching elements according to the fifth embodiment with reference to FIG. 7A to FIG. 7E. In the drive system according to the fifth embodiment, the switching means changes the switching speed of the power switching element Sw based on the amplitude of a phase current in the motor generator connected to the inverter IV.

FIGS. 7A to 7E are timing charts showing the transition of the switching speed of the switching element in the drive system according to the fifth embodiment of the present invention. In particular, FIG. 7A is a timing chart showing the transition of an amplitude of the phase current flowing in the power switching element Sw. FIG. 7B is a timing chart showing the transition of the voltage potential of the switching element 30. FIG. 7C is a timing chart showing the transition of the output voltage of the transformer in the drive system. FIG. 7B and FIG. 7C corresponds in timing chart to FIG. 3B and FIG. 3C. FIG. 7D is a timing chart showing the switching speed of the power switching element Sw when turned on. FIG. 7E is a timing chart showing the switching speed of the power switching element Sw when turned off;

When the amplitude of the phase current of the power switching element Sw becomes not less than a threshold value designated by the long and dash line in FIG. 7A, the switching element 30 is turned off. This switching control decreases the output voltage of the transformer 10. When the output voltage of the transformer 10 becomes not more than a threshold value designated by the long and dash line in FIG. 7C, the switching speed to switch to the turned-on state of the power switching element Sw is increased, and the switching speed to switch to the turned-off state of the power switching element Sw is decreased.

The more the current flowing in the power switching element Sw increases, the more a surge voltage or surge noise when the power switching element Sw is switched to the turned-on state decreases. On the other hand, the more the current flowing in the power switching element Sw increases, the more the surge voltage or noise when the power switching element Sw is switched to the turned-off state increases.

As described above, the drive system according to the fifth embodiment has the following features (8) and (9) in addition to the features (1), (3), (4), and (6), previously described.

(8) In the drive system according to the fifth embodiment, the output voltage of the transformer 10 is changed according to the information regarding the current which flows in the power switching element Sw. This makes it possible to largely decrease the electric power loss caused by changing the switching speed of the power switching element Sw while avoiding supplying an excess voltage of not more than the withstand voltage of the power switching element Sw.

(9) In the drive system according to the fifth embodiment, the regulator 52 is capable of decreasing the output voltage of the transformer 10. When the amplitude of the phase current of the power switching element Sw is large, the regulator 52 decreases the output voltage of the transformer 10. This control makes it possible to relax the state to easily increase the temperature of the drive unit DU. That is, on using the regulator 52 capable of decreasing the output voltage of the transformer 10, the more the output voltage of the transformer 10 increases, the more the regulator generates 52 its thermal energy, and the more the temperature of the regulator 52 increases.

On the other hand, because the temperature of the power switching element Sw is high when the amplitude of the phase current of the power switching element Sw is large, the thermal energy of the power switching element Sw is transmitted to the inside of the drive unit DU, and the temperature of the drive unit DU easily increased. It is therefore preferred to decrease the thermal energy generated in the regulator 52 when the temperature of the power switching element Sw is high in order to decrease the thermal energy generated in the drive unit DU.

Sixth Embodiment

A description will be given of the drive system for power switching elements according to the sixth embodiment with reference to FIG. 8.

In the drive system according to the sixth embodiment, the switching speed of the power switching element Sw is changed in analogue form based on the temperature, the amplitude and phase current of the power switching element Sw and the input voltage of the inverter IV.

Figure 8:
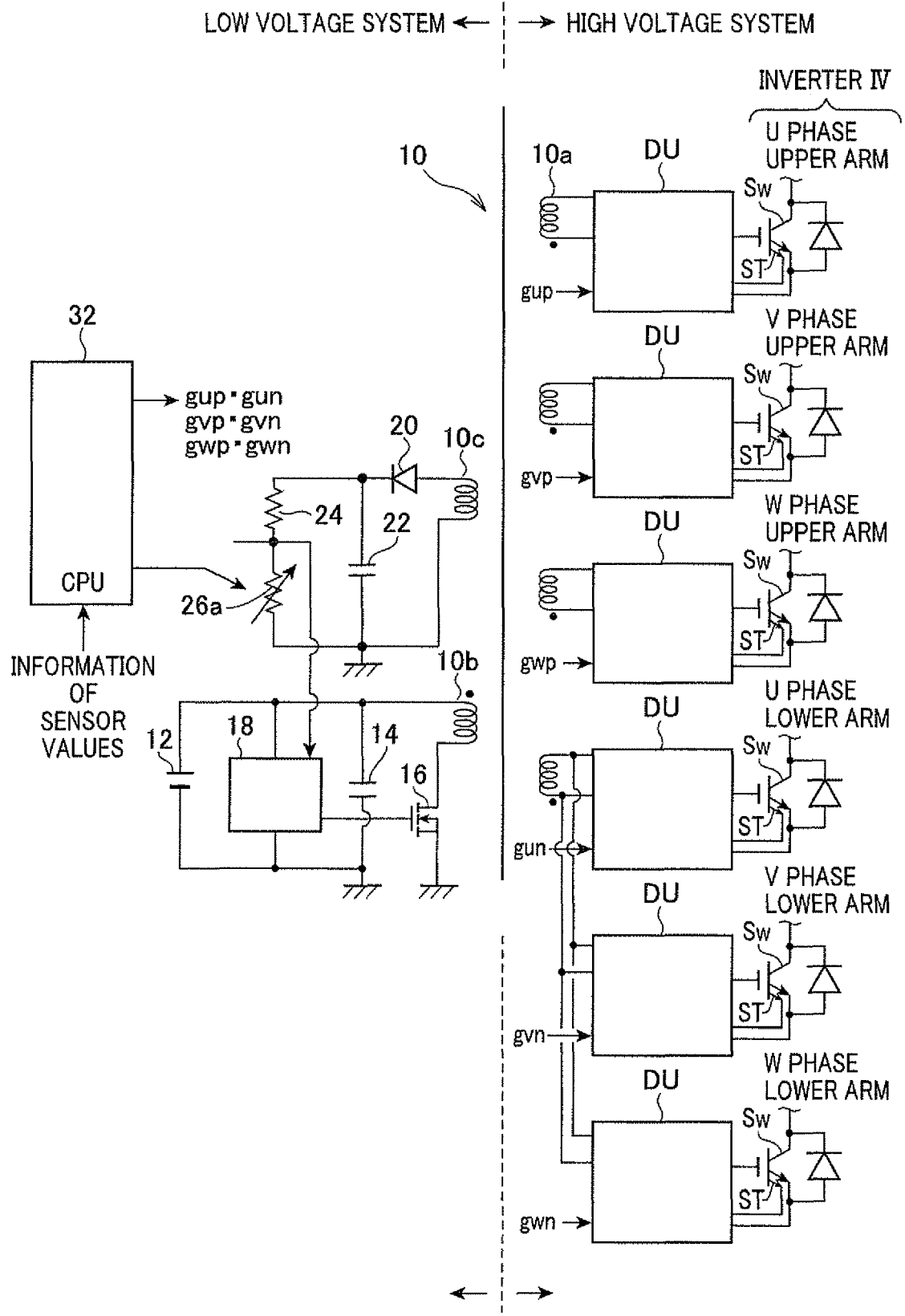
FIG. 8 is a view showing a schematic configuration of a drive system having the drive units DU according to a sixth embodiment of the present invention.

FIG. 8 is a view showing a schematic configuration of the drive system having the drive units DU according to the sixth embodiment of the present invention. In the drive system according to the sixth embodiment shown in FIG. 8, the same components in the drive system of the first embodiment shown in FIG. 1 and FIG. 2 are referred with the same reference numbers.

As shown in FIG. 8, the voltage of the primary side coil 10c of the transformer 10 is divided by the resistance 24 and a resistance 26a. The divided voltage is supplied as the voltage detection value to the voltage control part 18. The CPU 32 instructs the resistance value of the resistance 26a to change in analogue form based on the information regarding the temperature and the phase current of the power switching element Sw and the input voltage of the inverter IV. That is, the more the temperature of the power switching element Sw rises, the more the CPU 32 increases the resistance value of the resistance 26a in order to decrease the output voltage of the transformer 10. In addition, the more the amplitude of the phase current flowing in the power switching element Sw increases, the more for the CPU 32 to increase the resistance value of the resistance 26a in order to decrease the output voltage of the power switching element Sw. Further, the more the input voltage of the inverter IV is low, the more the CPU 32 increases the resistance value of the resistance 26a in order to decrease the output voltage of the transformer 10.

Figure 9:
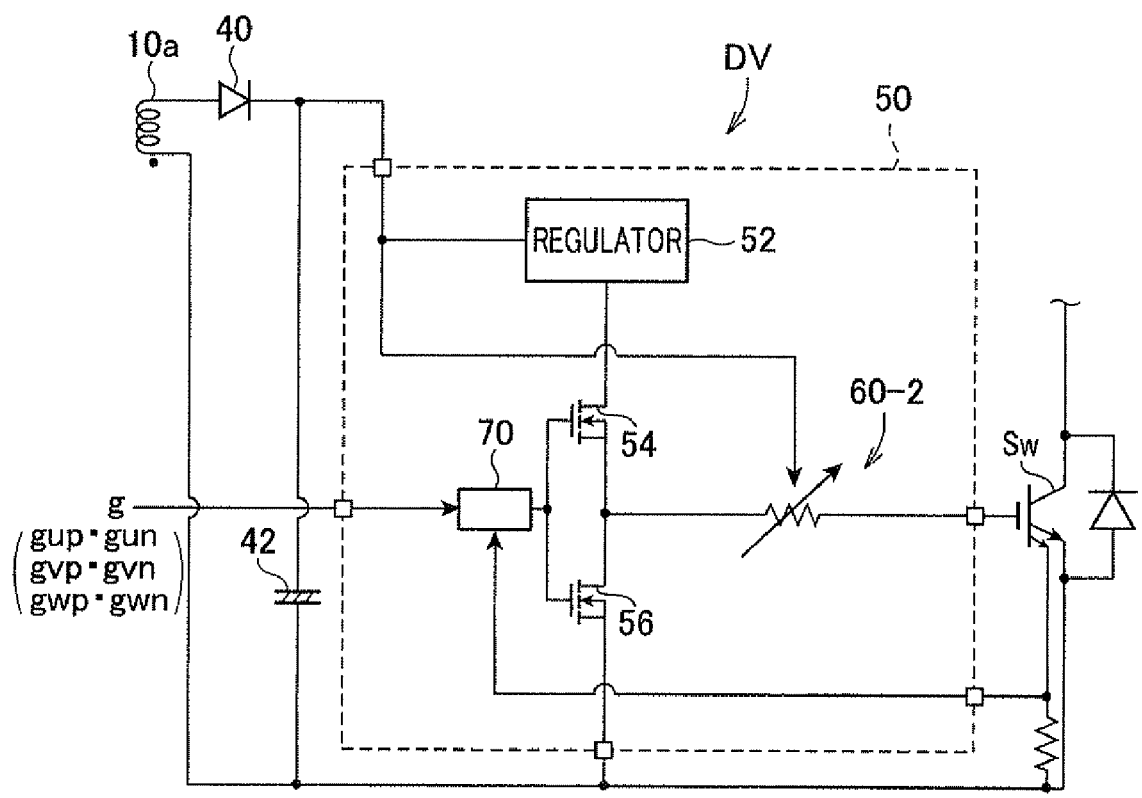
FIG. 9 is a view showing a circuit configuration of the drive unit DU in the drive system according to the sixth embodiment of the present invention.

FIG. 9 is a view showing a circuit configuration of each of the drive units DU in the drive system shown in FIG. 8 according to the sixth embodiment of the present invention. The same components between the drive unit shown in FIG. 2 and the drive unit shown in FIG. 9 are referred with the same reference numbers.

As shown in FIG. 9, the switching speed change part 60-2 is composed of a variable resistance which serves as the means to change in analogue form the resistance value of the charge path and the discharge path of the power switching element Sw. The voltage of the secondary side coil 10a of the transformer 10 is supplied to the switching speed change part 60-2. The switching speed change part 60-2 changes the resistance value thereof based on the voltage supplied from the secondary side coil 10a. That is, the more the output voltage of the transformer 10 decreases, the more the resistance value of the switching speed change part 60-2 decreases. The more the temperature of the power switching element Sw becomes higher than a predetermined temperature, the more the switching speed of the power switching element Sw is increased. In addition, the more the amplitude of the phase current flowing in the power switching element Sw increases, the more the switching speed to the turned-on state of the power switching element Sw is increased, and the more the switching speed to the turned-off state of the power switching element Sw is decreased. Further, the more the input voltage to the inverter IV is low, the more the switching speed of the power switching element Sw is increased As described above, the drive system according to the sixth embodiment of the present invention has the following feature (10) in addition to the features (1), (3), (4), (5), and (6), previously described.

(10) In the drive system according to the sixth embodiment, the switching speed of the power switching element Sw is changed in analogue form according to the change of the output voltage of the transformer 10. This makes it possible to further decrease the electric energy loss generated when the switching speed of the power switching element Sw is changed while avoiding applying an excess voltage of not less than the withstand voltage of the power switching element Sw.

Other Modifications

The concepts of the present invention are not limited by the first to sixth embodiments, previously described. For example, it is possible for the drive system according to the present invention to have the following modifications.

It is possible to change the circuit configuration of the drive system of the second embodiment or the third embodiment by using the feature of the circuit configuration of the drive system of the fourth embodiment, where the circuit configuration of the drive system according to the fourth embodiment is changed from the that of the drive unit of the first embodiment of the present invention.

It is also possible to change the circuit configuration of the drive system of the second embodiment or the third embodiment by using the feature of the circuit configuration of the drive system of the fifth embodiment, where the circuit configuration of the drive system of the fifth is changed from the that of the drive system of the first embodiment of the present invention.

When the circuit configuration of the drive system according to the third embodiment is changed, it is necessary to have the means to electrically connect the gate of the power switching element Sw to a member which is lower in voltage potential than the emitter of the power switching element Sw in addition to having the means which electrically connects the gate of the power switching element Sw to a member which is higher in voltage potential rather than the emitter of the power switching element Sw. Further, this member which is lower in voltage potential than the emitter is changed based on the voltage of the secondary side coil 10a of the transformer 10.

It is further possible to change the circuit configuration of the drive system of the second embodiment or the third embodiment by using the feature of the circuit configuration of the drive system of the sixth embodiment, where the circuit configuration of the drive unit of the sixth embodiment is changed from that of the drive system of the first embodiment of the present invention.

For example, when the circuit configuration of the drive system according to the third embodiment is changed, it is sufficient for the regulator 52a to have the function to adjust the output voltage of the transformer 10 based on the input voltage which is supplied to the regulator 52a.

In the fifth embodiment, the switching speed of the power switching element Sw is changed based on the amplitude of the current of the motor generator. The concept of the present invention is not limited by this. For example, it is acceptable to use the current value during the turned-on state of the motor generator when the switching speed of the power switching element Sw is changed. This can be achieved by using the condition where the motor generator is controlled by the power factor of 1 and the operation signal "g" is generated by performing a PWM (pulse width modulation) control with a triangle wave comparison, and by estimating the phase of the phase current based on the pulse width of the operation signal "g".

When the input voltage of the inverter IV is not less than a predetermined voltage, it is possible to increase the output voltage of the transformer 10. On the other hand, it is possible to perform another method to have the features (1), (3), and (6), previously described, by increasing the output voltage of the transformer 10 in the following cases (a) and (b):

(a) when the temperature of the power switching element Sw is increased in the circuit configuration of the drive system according to the first embodiment; or (b) when the phase current has a large amplitude in the circuit configuration of the drive unit according to the fifth embodiment.

It is possible to use one or two parameters used when the switching speed of the power switching element Sw is changed, where the parameters are the temperature and amplitude of the current of the power switching element Sw and the input voltage to be supplied to the inverter IV.

The drive systems according to the embodiments previously described use the resistance composed of different linear elements having a different resistance value with which the resistance of the electric path between the gate of the power switching element Sw and the regulator 52 is changed. The present invention is not limited by this circuit configuration. For example, it is possible to use the means to change the resistance value between the collector and emitter of a bipolar transistor, as disclosed in the Japanese patent laid open publication No. JP 2009-55654.

It is possible to use the means to change in stages the output voltage of the secondary side coil 10a of the transformer 10 to a plurality of different voltages, instead of using the means which changes in stages the output voltage of the secondary side coil 10a of the transformer 10 to a different voltage.

It is possible to use the means to change the switching speed of the power switching element Sw by only one way from the turned-on/off state to the turned-off/on state, instead of using the means to change the switching speed of the power switching element Sw by both ways, from the turned-on state to the turned-off state, and from the turned-off state to the turned-on state.

The drive system according to the present invention is not limited by using the flyback type converter. For example, it is possible to use a forward type converter. In this case to use the forward type converter, it is preferable to mount a choke coil to smooth the current flowing in each of the secondary side coils of the transformer.

The drive system according to the present invention performs the process to change the output voltage of the secondary side coil 10a of the transformer 10 by changing the detection value of a control variable (control voltage) in the voltage control part 18. The present invention is not limited by this. For example, it is sufficient for the drive system to use the means capable of changing the target value of the control variable used in the voltage control part 18.

The drive systems according to the first to sixth embodiments of the present invention use the various types of means to detect the output voltage of the secondary side coil 10a of the transformer 10. The present invention is not limited by the first to sixth embodiments. For example, it is acceptable to use the means to detect the voltage of one of the secondary side coils of the transformer 10, and transfer the detection result to the low voltage system It is also acceptable to use the means capable of performing the open loop control in order to change the output voltage of the secondary side coil 10a of the transformer 10 instead of the means to perform the feedback control.

The drive system according to the present invention uses a N channel field effect transistor which serves as the open and close means to open and close the electric path between the regulator 52 and the gate of the power switching element Sw. The present invention is not limited by this. For example, it is possible to use an available field effect transistor such as a P channel MOS transistor.

It is possible to use a converter capable of boosting the voltage of a high voltage battery and outputting the boosted voltage to the inverter, instead of using the inverter which serves as the electric power conversion circuit to supply the electric power to a main device such as the motor generator mounted to a vehicle. In this case, it is possible to apply the concept of the present invention to a drive system to drive power switching elements which form a converter.

It is also possible to use the power switching element which forms a DC/DC converter capable of decreasing the voltage of an on-vehicle battery and supplying the decreased voltage to a secondary battery as an auxiliary battery, instead of the power switching element which forms the inverter.

It is also possible to apply the drive system according to the present invention to the power switching element mounted to an electric vehicle instead of applying it to a hybrid vehicle explained in the first to sixth embodiment of the present invention.

The first to sixth embodiments according to the present invention use the power switching element Sw. The present invention is not limited by this. For example, it is possible to use a IGBT without the sense terminal ST, and also to use a field effect transistor such as a power MOS field effect transistor.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A drive system that changes a switching speed of each of a plurality of power switching elements, comprising:
    operation means for controlling an operational voltage of a primary coil of a transformer in order to change an output voltage of a secondary coil of the transformer;
    drive units configured to receive the output voltage of the secondary coil of the transformer as a voltage of a power source and to supply a voltage to power switching elements of a voltage control type; and
    change means for changing a switching speed of the power switching elements on the basis of the output voltage of the secondary coil of the transformer, using at least one selected from:
    (a) a resistance value of an electrical path through which the voltage is supplied to a conductive control terminal of each of the power switching elements; and
    (b) a capacitance between an output terminal and the conductive control terminal of each of the power switching elements.

2. The drive system according to claim 1, further comprising voltage control means for receiving, as a voltage of a power source, the output voltage of the secondary coil of the transformer, the voltage control means changing the output voltage of the secondary coil of the transformer to a predetermined voltage value, and outputting the changed voltage as an output voltage, wherein the drive units supply the output voltage of the voltage control means to the power switching elements of a voltage control type in order to drive the power switching elements.

3. The drive system according to claim 2, wherein the voltage control means decreases the output voltage of the secondary coil of the transformer, and the operation means decreases the output voltage of the secondary coil of the transformer when it is estimated that the temperature of the power switching elements becomes high.

4. The drive system according to claim 1, wherein the operation means controls the operational voltage of the primary coil of the transformer in order to change the output voltage of the secondary coil of the transformer on the basis of a temperature of the power switching elements.

5. The drive system according to claim 1, wherein the power switching elements form an inverter which is electrically connected to an electric rotary machine, and the operation means controls the operational voltage of the primary coil of the transformer in order to change the output voltage of secondary coil of the transformer on the basis of an input voltage supplied to the inverter.

6. The drive system according to claim 1, wherein the operation means changes in analogue form the output voltage of each of secondary side coils of the transformer, and the change means changes in analogue form the switching speed of each of the power switching elements based on the change in analogue form of the output voltage of the secondary side coils of the transformer.

7. The drive system according to claim 1, wherein the operation means the operation means stepwise changes the output voltage of the secondary coil of the transformer, and the change means stepwise changes the switching speed of each of the power switching elements on the basis of the stepwise-changed output voltage of the secondary coil of the transformer.

8. The drive system according to claim 1, wherein the operational means changes in analogue form the output voltage of the secondary coil of the transformer, and the change means changes in analogue form the switching speed of each of the power switching elements on the basis of the changed output voltage in analogue form of the secondary coil of the transformer.

9. A drive system for changing a switching speed of each of a plurality of power switching elements, comprising:

operation means for controlling an operational voltage of a primary coil of a transformer in order to change an output voltage of a secondary coil of the transformer;

voltage control means for receiving as a voltage of a power source, the output voltage of the secondary coil of the transformer, the voltage control means changing the output voltage of the secondary coil of the transformer to a predetermined voltage value, and outputting the changed voltage as an output voltage, drive units configured to supply the output voltage of the voltage control means to the power switching elements of a voltage control type in order to drive the power switching elements; and change means for changing a switching speed of the power switching elements, by changing the output voltage of the voltage control means on the basis of the output voltage of the secondary coil of the transformer.

\* \* \* \* \*